US011624679B2

United States Patent
Okuta et al.

(10) Patent No.: US 11,624,679 B2
(45) Date of Patent: Apr. 11, 2023

(54) OPTICAL PROBE, OPTICAL PROBE ARRAY, TEST SYSTEM AND TEST METHOD

(71) Applicant: Kabushiki Kaisha Nihon Micronics, Tokyo (JP)

(72) Inventors: Michitaka Okuta, Tokyo (JP); Yuki Saito, Tokyo (JP); Toshinaga Takeya, Aomori (JP); Shou Harako, Aomori (JP); Jukiya Fukushi, Aomori (JP); Minoru Sato, Aomori (JP); Hisao Narita, Aomori (JP)

(73) Assignee: Kabushiki Kaisha Nihon Micronics, Musashino (CN)

( * ) Notice: Subject to any disclaimer, the term of this patent is extended or adjusted under 35 U.S.C. 154(b) by 212 days.

(21) Appl. No.: 17/039,878

(22) Filed: Sep. 30, 2020

(65) Prior Publication Data

US 2021/0102864 A1   Apr. 8, 2021

(30) Foreign Application Priority Data

Oct. 4, 2019 (JP) .............................. JP2019-183669

(51) Int. Cl.
  *G01M 11/02* (2006.01)
  *G01R 1/073* (2006.01)
  *G01R 31/26* (2020.01)
  *H01S 5/00* (2006.01)

(52) U.S. Cl.
  CPC ......... *G01M 11/0207* (2013.01); *G01R 1/073* (2013.01); *G01R 31/2607* (2013.01); *H01S 5/0014* (2013.01)

(58) Field of Classification Search
  CPC ............... G01M 11/0207; G01R 1/073; G01R 31/2607; G01R 1/071; H01S 5/0014; G01N 21/9501; G01N 21/8851; G01N 2021/9511; G02B 6/2551; G02B 6/262; G02B 6/02; H01L 22/12
  USPC ....................................................... 250/227.3
  See application file for complete search history.

(56) References Cited

U.S. PATENT DOCUMENTS

| 10,180,546 B2 | 1/2019 | Kondo et al. |
| 2006/0008226 A1 | 1/2006 | McCann et al. |
| 2006/0114008 A1 | 6/2006 | Fujii |
| 2013/0276542 A1* | 10/2013 | Herzog ............... G01J 1/04 73/655 |
| 2019/0056458 A1 | 2/2019 | Arai |

FOREIGN PATENT DOCUMENTS

| CN | 107003488 A | 8/2017 |
| CN | 109557451 A | 4/2019 |
| JP | S6231136 A | 2/1987 |
| JP | S63224385 A | 9/1988 |
| KR | 20060059786 A | 6/2006 |
| KR | 20190019841 A | 2/2019 |

\* cited by examiner

*Primary Examiner* — Farhana A Hoque
(74) *Attorney, Agent, or Firm* — Lorenz & Kopf, LLP

(57) ABSTRACT

An optical probe receives an optical signal output from a test subject. The optical probe includes an optical waveguide composed of a core portion and a cladding portion disposed on an outer periphery of the core portion, wherein an incident surface of the optical waveguide, which receives the optical signal, is a convex spherical surface with a constant curvature radius.

9 Claims, 14 Drawing Sheets

OPTICAL PROBE, OPTICAL PROBE ARRAY, TEST SYSTEM AND TEST METHOD

CROSS-REFERENCE TO RELATED APPLICATIONS

This application is based upon and claims the benefit of priority from prior Japanese Patent Application number P2019-183669, filed on Oct. 4, 2019; the entire contents of which are incorporated by reference herein.

BACKGROUND OF THE INVENTION

Field of the Invention

Embodiments described herein relate generally to an optical probe, an optical probe array, a test system and a test method, which are for use in testing characteristics of a test subject.

Description of the Related Art

By using the silicon photonics technology, an optical semiconductor element that receives an electrical signal and an optical signal as input/output signals is formed on a semiconductor substrate. In order to test characteristics of the optical semiconductor element in a wafer state, it is effective to connect the optical semiconductor element and a measuring apparatus such as a tester to each other by using a test system including an electric probe that allows propagation of the electrical signal and an optical probe that allows propagation of the optical signal.

For example, disclosed is a method for acquiring characteristics of an optical semiconductor element by bringing a tip end of an optical fiber close to a test subject. Moreover, disclosed is an apparatus that tests characteristics of an optical semiconductor element by attaching a lens to a tip end of an optical fiber and placing a test subject in the vicinity of a focal point of a lens.

Heretofore, for a semiconductor substrate on which a plurality of optical semiconductor elements are formed, characteristics of the optical semiconductor elements are tested one by one while alignment between the optical semiconductor elements and optical probes is being performed. At this time, it is necessary to perform the alignment between the optical semiconductor elements and the optical probes with high accuracy so that optical signals propagate between the optical semiconductor elements and the optical probes with a predetermined intensity. Therefore, there has been a problem that there increases a time to test all of the optical semiconductor elements formed on the semiconductor substrate. Since it has been difficult to test all of the optical semiconductor elements, whether the optical semiconductor elements are acceptable has not been able to be determined sufficiently, resulting in a deterioration of yield of products of the optical semiconductor elements.

SUMMARY OF THE INVENTION

An aspect of the present invention is an optical probe that receives an optical signal from a test subject, including an optical waveguide composed of a core portion and a cladding portion disposed on an outer periphery of the core portion, wherein an incident surface of the optical waveguide, the incident surface receiving the optical signal, is a convex spherical surface with a constant curvature radius.

DETAILED DESCRIPTION OF THE INVENTION

Figure 1:
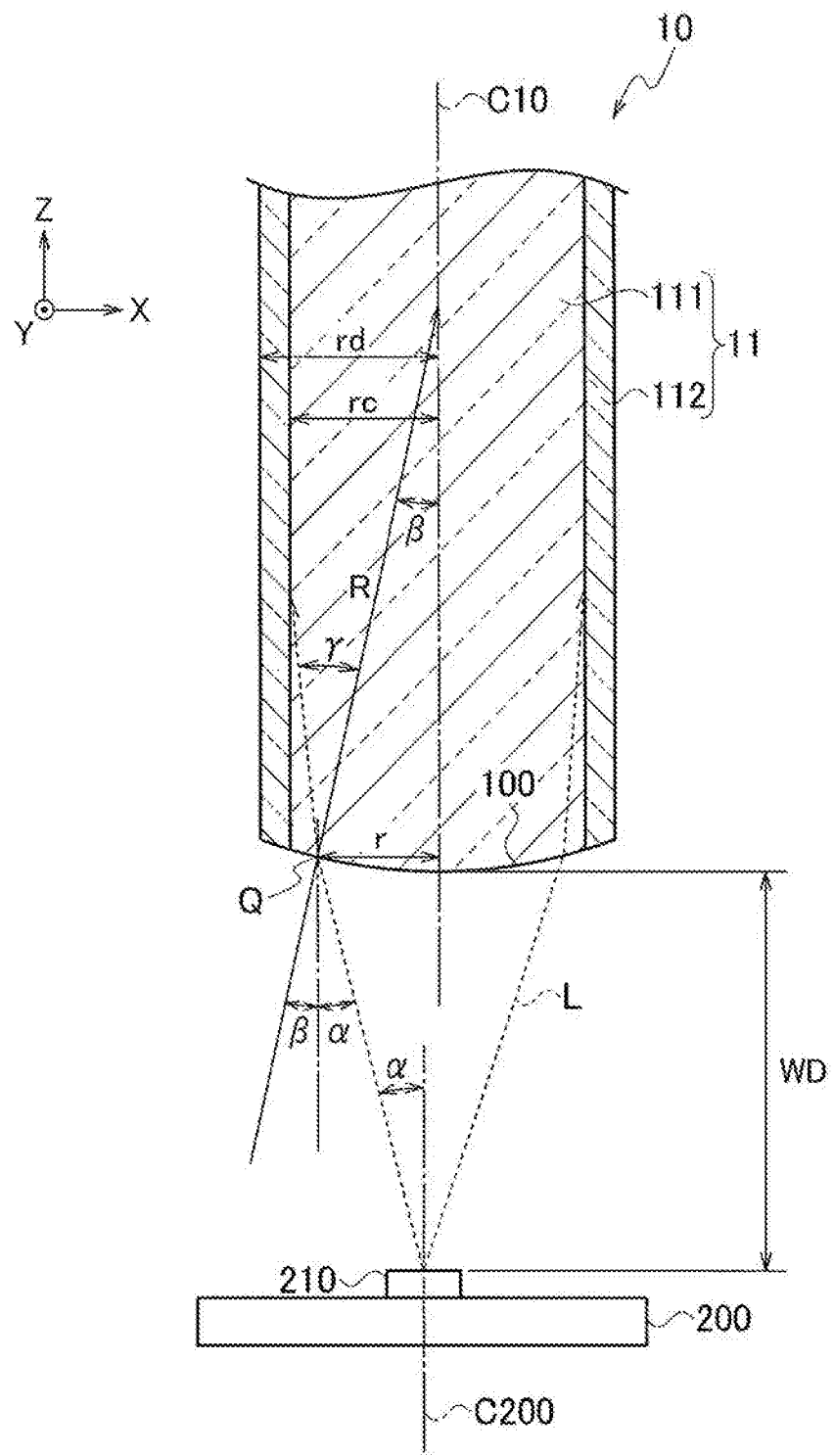
FIG. 1 is a schematic view illustrating a configuration of an optical probe according to a first embodiment of the present invention.

Next, a description will be given of embodiments of the present invention with reference to the drawings. In the following description referring to the drawings, the same or similar reference numerals are assigned to the same or similar portions. However, it should be noted that the drawings are schematic. Moreover, the embodiments illustrated below exemplify a device and a method for embodying the technical idea of this invention, and the embodiments of this invention do not specify structures, dispositions and the like of constituent components to those described below. The embodiments of this invention can be modified in various ways within the scope of patent claims.

First Embodiment

As illustrated in FIG. 1, an optical probe 10 according to a first embodiment of the present invention receives an optical signal L output from a light emitting portion 210 of a test subject 200. The optical probe 10 includes a refractive index distribution-type optical waveguide 11 composed of a core portion 111 and a cladding portion 112 disposed on an outer periphery of the core portion 111. A refractive index of the core portion 111 is larger than a refractive index of the cladding portion 112. For example, the optical probe 10 can be manufactured by using a graded index-type (GI-type) optical fiber for the optical waveguide 11. As illustrated in FIG. 1, an incident surface 100 of the optical waveguide 11 that receives the optical signal L is a convex spherical surface with a constant curvature radius R.

In FIG. 1, each extending direction of a central axis C10 of the core portion 111 of the optical probe 10 and of an optical axis C200 of the optical signal L is defined as a Z-axis direction. Moreover, a plane perpendicular to the Z-axis direction is defined as an XY plane, in which a horizontal direction of the drawing is defined as an X-axis direction, and a direction perpendicular to the drawing is defined as a Y-axis direction. The optical probe 10 is located above the test subject 200 so that the optical axis C200 of the optical signal L and the central axis C10 of the core portion 111 are parallel to each other.

For example, the test subject 200 is an optical semiconductor element such as a vertical cavity surface emitting laser (VCSEL). The light emitting portion 210 and the optical probe 10 are optically connected to each other, and the optical signal L output from the light emitting portion 210 enters the optical probe 10.

The optical probe 10 and the test subject 200 are disposed separately from each other by a working distance WD along the Z-axis direction. The working distance WD is set within a range where the optical probe 10 can receive the optical signal L output from the test subject 200. For example, the working distance WD is set so that a radiation range of the optical signal L remains inside of an outer edge of the core portion 111 on the incident surface 100. Here, the radiation range of the optical signal L is set to a range along a direction where the optical signal L travels with an intensity of $1/e^2$ or more of a peak value thereof.

With regard to the optical signal L in the radiation range, an angle made by a travel direction of the optical signal L that enters an incident point Q on the incident surface 100 and by the optical axis C200 is defined as "radiation half angle α". Moreover, as illustrated in FIG. 1, a central angle of the incident surface 100 at the incident point Q is represented as 2×β by using a central half angle β.

Note that, with regard to the radiation half angle α, one in which an angle made with the optical axis C200 is maximum is defined as "maximum radiation half angle αm". That is, when the working distance WD is a maximum working distance WD possible between the incident surface 100 and the test subject 200 (hereinafter, the maximum working distance WD will be referred to as "maximum working distance WDm"), the maximum radiation half angle αm is an angle made by a travel direction of the optical signal L at an outermost edge of the radiation range and by the optical axis C200.

Moreover, one with a maximum central half angle β is defined as "maximum central half angle βm". That is, the maximum central half angle βm is a central half angle at an outermost edge of the incident surface 100 of the core portion 111 in the case of the maximum working distance WDm.

The optical signal L enters the incident point Q of the incident surface 100 at an incident angle (α+β). As illustrated in FIG. 1, an angle made by a travel direction of the optical signal L immediately after the optical signal L passes through the incident surface 100 and by a curvature radius direction is defined as a refraction angle γ.

A refractive index n(r) of the core portion 111 at the incident point Q located at a distance r from the central axis C10 in a radial direction is represented by Equation (1):

$$n(r)=n0\times(1-(A^{1/2}\times r)^2/2) \qquad (1)$$

In Equation (1), n0 is a refractive index at the central axis C10 of the core portion 111, and $A^{1/2}$ is a refractive index distribution constant of the core portion 111. The refractive index distribution constant $A^{1/2}$ is represented by Equation (2):

$$A^{1/2}=\{(n0^2-nd^2)/(n0\times rc)^2\}^{1/2} \qquad (2)$$

In Equation (2), nd is a refractive index of the cladding portion 112, and rc is a radius of the core portion 111 (hereinafter, this radius will be referred to as "core radius").

As the refractive index distribution constant $A^{1/2}$ is larger, an effect of confining the optical signal L in the core portion 111 becomes stronger, and a lens effect becomes larger. That is, as a difference between the refractive index n0 on the central axis C10 of the core portion 111 and the refractive index nd of the cladding portion 112 is larger, and as the core radius rc is smaller, the refractive index distribution constant $A^{1/2}$ is larger, the effect of confining the optical signal L in the core portion 111 is stronger, and the optical signal L is bent sharply inside the core portion 111.

In order that the optical signal L propagates through the core portion 111 in a shortest distance to reduce a transmission loss in the optical probe 10, preferably, the optical signal L travels through the core portion 111 along a direction parallel to the central axis C10. That is, with regard to the optical signal L with an incident angle (αm+β), a relationship between the central half angle β and the refraction angle γ is set substantially to γ=β. Thus, the transmission loss of the optical signal L in the optical probe 10 can be suppressed.

Figure 2:
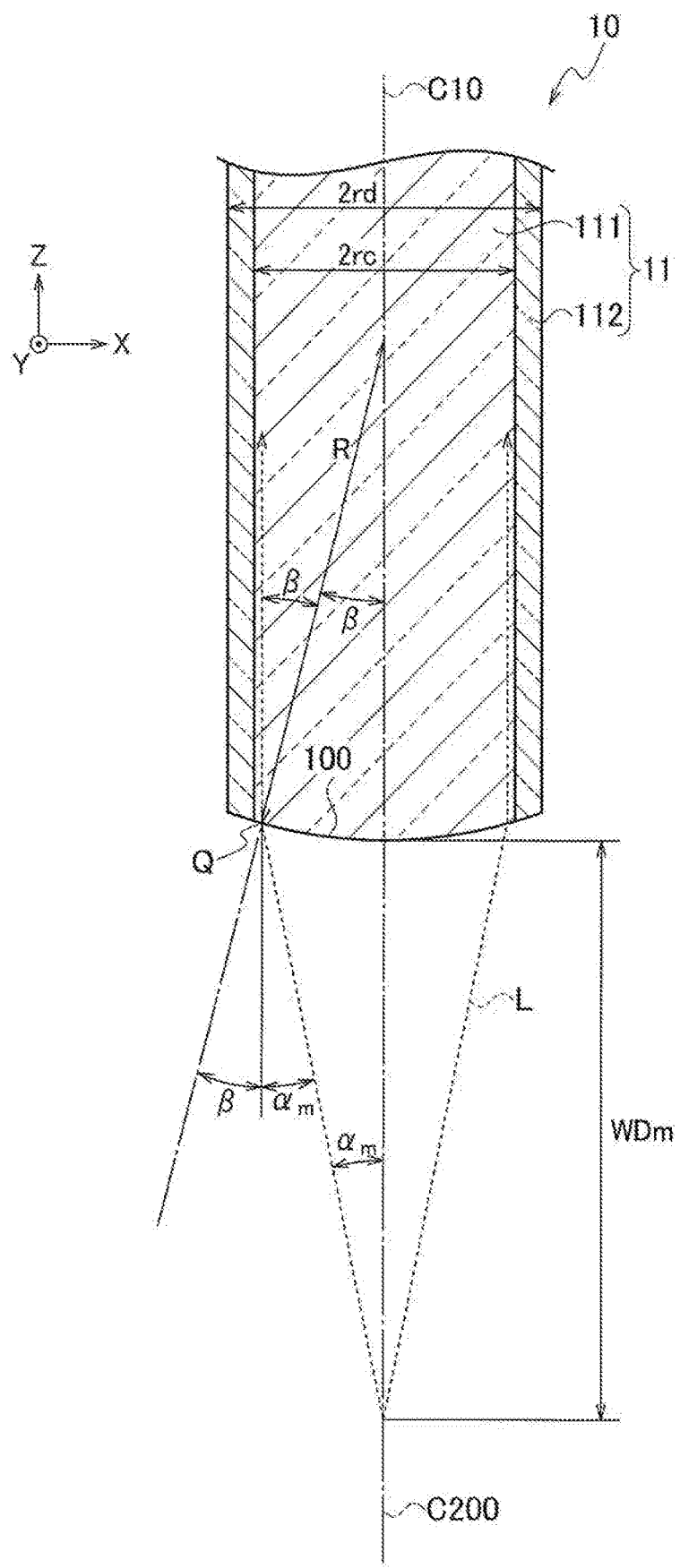
FIG. 2 is a schematic view illustrating a state in which an optical signal propagates through the optical probe according to the first embodiment of the present invention.

FIG. 2 illustrates a state in which the optical signal L travels in the case of γ=β. In FIG. 2, the central axis C10 of the core portion 111 and the optical axis of the optical signal L overlap each other. Thereafter, the optical signal L propagates through the inside of the core portion 111 in a sine wave shape about the optical axis C200 in a cycle of $2\pi/A^{1/2}$. Moreover, an interval between the incident surface 100 of the optical probe 10 and the test subject 200 is the maximum working distance WDm. At this time, Equation (3) is established from the Snell's law:

$$n(r)\times\sin(\beta)=\sin(\alpha m+\beta) \qquad (3)$$

The maximum radiation half angle αm is a half angle of a radiation angle at which the intensity of the optical signal L becomes $1/e^2$ of the peak value. The radiation half angle α of the optical signal L when the working distance WD is shorter than the maximum working distance WDm is smaller than the maximum radiation half angle αm. That is, a relationship of αm≥α>0 is established.

A core diameter of the incident surface 100 of the optical probe 10 is $2rc$. Here, when an outer diameter of the optical probe 10 including the cladding portion 112 is $2rd$ as illustrated in FIG. 2, the maximum working distance WDm is approximated by Equation (4) in the case of $R > 2rd$:

$$WDm = rc/\tan(\alpha m) \quad (4)$$

A range of the working distance WD in the test of the test subject 200 is $WDm > WD > 0$.

From Equations (3) and (4), the curvature radius R of the incident surface 100 of the optical probe 10 is represented by Equation (5):

$$R = WDm \times \tan(\alpha m)/\{\sin(\beta) + (\cos(\beta) - 1) \times \tan(\alpha m)\} \quad (5)$$

From Equation (3), the central half angle β is represented by Equation (6):

$$\beta = \tan^{-1}\{\sin(\alpha m)/(n(r) - \cos(\alpha m))\} \quad (6)$$

Figure 3:
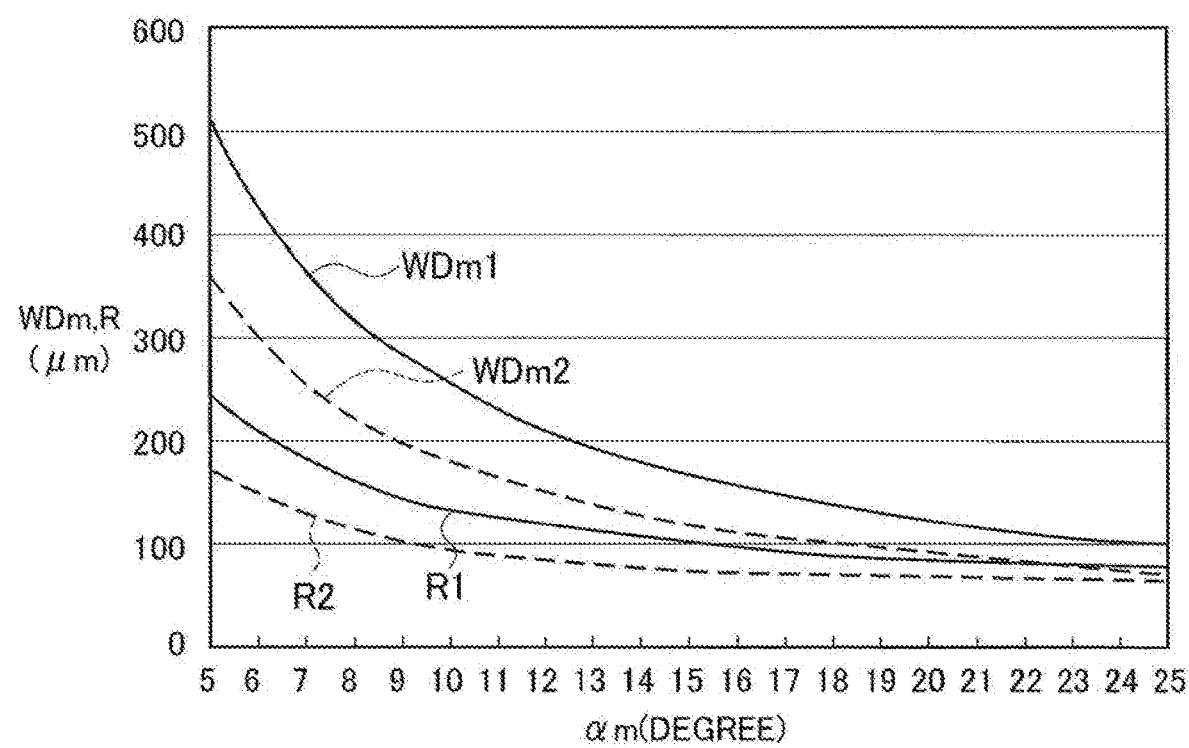
FIG. 3 is a graph illustrating relationships between incident surface curvature radii and maximum working distances of optical probes according to the first embodiment of the present invention and maximum radiation half angles of the optical signal.

FIG. 3 illustrates results of calculating relationships between the maximum radiation half angles αm of the optical signal L and the curvature radii R of the incident surfaces 100 and the maximum working distances WDm. In FIG. 3, a curvature radius of such an optical probe 10 in which a numerical aperture NA is 0.29 and a core radius rc is 44.5 μm is indicated as R1, and a maximum working distance thereof is indicted as WDm1. Moreover, a curvature radius of such an optical probe 10 in which a numerical aperture NA is 0.275 and a core radius rc is 31.25 μm is indicated as R2, and a maximum working distance thereof is indicted as WDm2. As the core diameter of the optical probe 10 is larger, the working distance WD between the test subject 200 and the incident surface 100 of the optical probe 10 can be extended. Moreover, as the core diameter is larger, the curvature radius R becomes larger. For example, when the maximum radiation half angle αm of the optical signal L is 12 degrees, in the optical probe 10 in which the numerical aperture NA is 0.29 and the core radius rc is 44.5 μm, the curvature radius R just needs to be set to 115 μm, and the working distance WD just needs to be set to 200 μm or less.

Note that, by an optical probe array in which such optical probes 10 are arranged in an array shape, a plurality of the test subjects 200 arranged in an array shape on a semiconductor substrate can be tested simultaneously. The optical probe array is composed by arraying a plurality of the optical probes 10 while orienting the incident surfaces 100 in the same direction. The optical probe array will be examined below.

At the time of mounting the optical probes 10 in an array shape to manufacture the optical probe array, tolerances δz, δx and δy occur in the Z-axis direction, the X-axis direction and the Y-axis direction, respectively due to tolerances in machine work and mounting. Hereinafter, the tolerances δz, δx and δy will also be referred to as "tolerances δ" collectively. Moreover, the tolerance δx in the X-axis direction on the XY plane and the tolerance δy in the Y-axis direction thereon will also be referred to as a tolerance δxy. Here, $\delta xy = (\delta x^2 + \delta y^2)^{1/2}$ is established.

Figure 4:
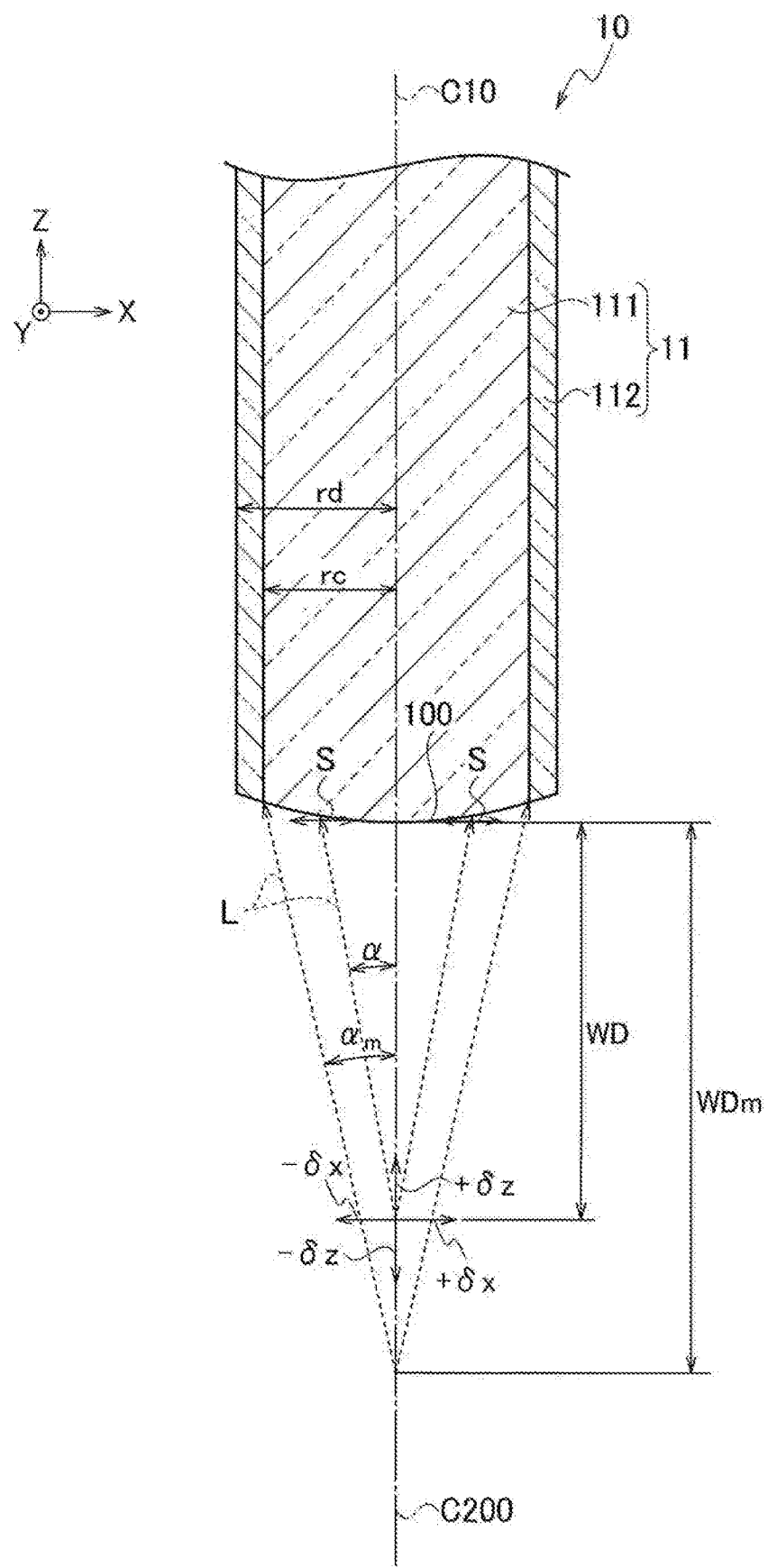
FIG. 4 is a schematic view for explaining an influence of tolerances in the optical probe according to the first embodiment of the present invention.

As illustrated in FIG. 4, the tolerances δ are represented as tolerances of a position of a light source of the optical signal L. Due to influences of the tolerances δ, a deviation S occurs in a position of the incident surface 100 that receives the optical signal L. Therefore, for the tolerance δxy and the tolerance δz at the time of manufacturing the optical probe array, the working distance WD needs to satisfy a relationship of the following Equation (7):

$$WDm > (rc - \delta xy)/\tan(\alpha m) - \delta z \geq WD > 0 \quad (7)$$

When the working distance WD does not satisfy the relationship of Equation (7), the radiation range of the optical signal L on the incident surface 100 becomes wider than the core diameter of the optical probe 10. In that case, an amount of the optical signal L, which does not enter the incident surface 100, becomes a transmission loss, which becomes a variation factor of loss characteristics. Hence, in order to stably receive the optical signal L by the optical probe 10, the working distance WD is set so as to satisfy Equation (8):

$$(rc - \delta xy)/\tan(\alpha m) - \delta z \geq WD \quad (8)$$

Figure 5:
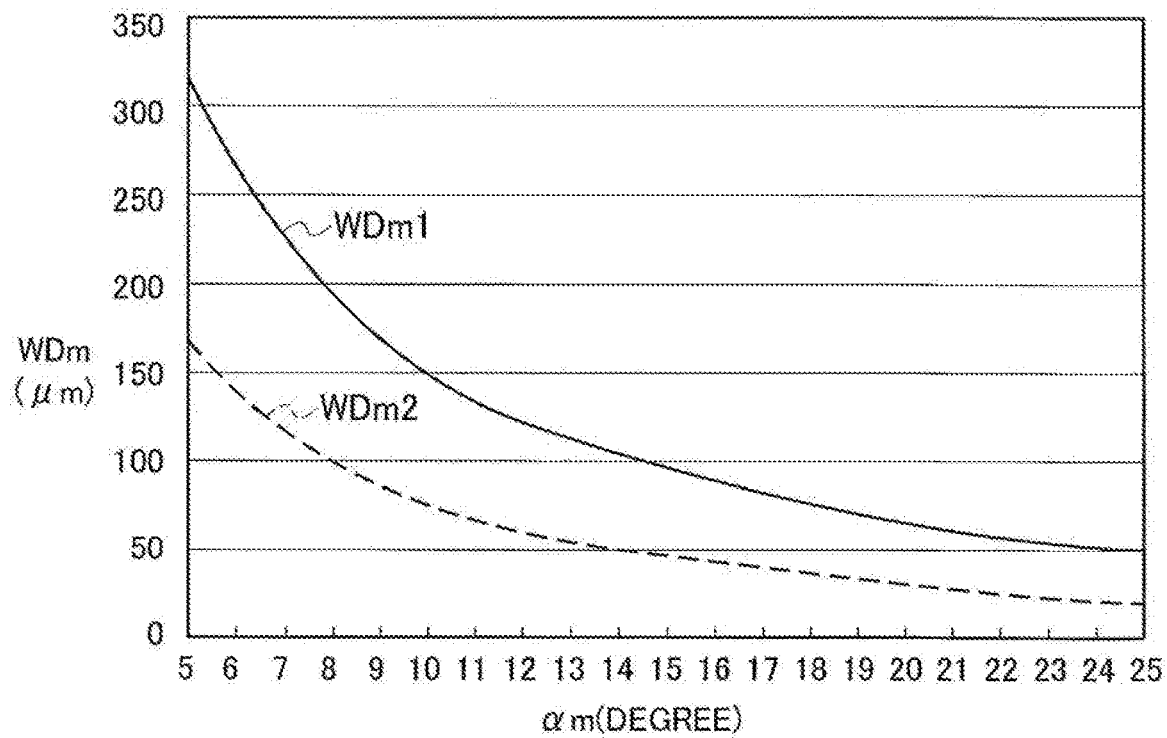
FIG. 5 is a graph illustrating relationships between the maximum working distances of the optical probes according to the first embodiment of the present invention and the maximum radiation half angles of the optical signal.

FIG. 5 is a graph illustrating relationships each between the maximum radiation half angle αm and the maximum working distance WDm when the tolerance δxy is ±15 μm and the tolerance δz is ±15 μm. The maximum working distance WDm1 illustrated by a solid line in FIG. 5 is a maximum working distance of such a large diameter optical probe 10 in which a numerical aperture NA is 0.29 and a core diameter is as large as 89 μm. Meanwhile, the maximum working distance WDm2 illustrated by a broken line is a maximum working distance of such an optical probe 10 in which a numerical aperture NA is 0.275 and a core diameter is as standard as 62.5 μm. Here, such "large diameter" refers to a diameter larger than 50 μm and 62.5 μm which are standard core diameters.

The maximum working distance WDm of the optical probe 10 can be set in response to the tolerances δ in the respective axial directions and the maximum radiation half angle αm. For example, in the case of the optical probe 10 in which the numerical aperture NA is 0.29 and the core diameter is 89 μm, the maximum working distance WDm is 125 μm when the maximum radiation half angle αm of the optical signal L is 12 degrees. Hence, the working distance WD of the optical probe 10 and the optical probe array just needs to be set to 125 μm or less. By this setting, the test subject 200 can be tested in a state in which a loss variation is almost none in a range where the tolerances δ on the XY plane and the Z-axis direction are ±15 μm.

Figure 6:
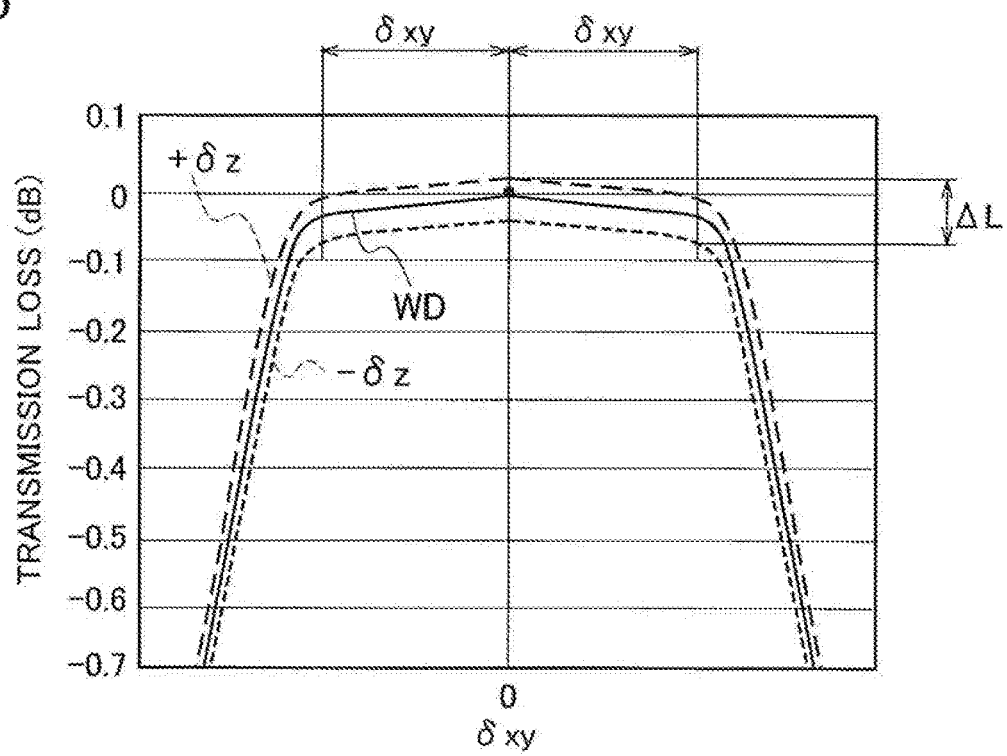
FIG. 6 is a graph illustrating relationships between transmission losses and the tolerances in the optical probe according to the first embodiment of the present invention.

FIG. 6 is a graph illustrating relationships each between the tolerance δxy on the XY plane and the tolerance δz in the Z-axis direction and such a transmission loss of the optical signal L. In FIG. 6, a transmission loss at the working distance WD is indicated by a solid line, a transmission loss at a working distance WD−(+δz) is indicated by a long-dashed dotted line (+δz), and a transmission loss at a working distance WD−(−δz) is indicated by a short-dashed dotted line (−δz). Note that the variation of the transmission loss, which is caused by the tolerances δ, is indicated as a loss variation ΔL.

Here, a condition of the optical probe 10 in which the transmission loss remains within a desired range is set such that the loss variation ΔL is 0.1 dB or less with respect to the tolerance δxy on the XY plane and the tolerance δz in the Z-axis direction.

That is, preferably, the optical probe array is composed by using the optical probes 10 in which the loss variation ΔL caused by the tolerances δ is 0.1 dB or less. As a range of absolute values of the tolerances δ in which the loss variation ΔL becomes 0.1 dB or less is larger, a larger number of the optical probes 10 can be arranged in an array shape to compose the optical probe array. In accordance with the optical probe array having a large number of the optical probes 10, the number of test subjects testable simultaneously increases. Thus, a time required for testing the test subjects in a wafer state can be shortened.

FIGS. 7A to 7D show shapes of optical probes manufactured by the inventors of the present invention. In each of the optical probes shown in FIGS. 7A to 7D, the numerical aperture NA is 0.29, and the core radius rc is 44.5 µm.

Figure 7A:
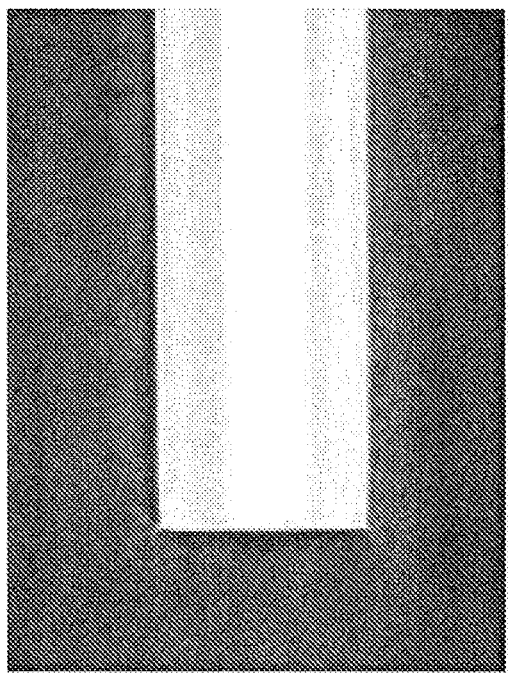
FIGS. 7A to 7D are photographs showing shapes of optical probes.
Figure 7B:
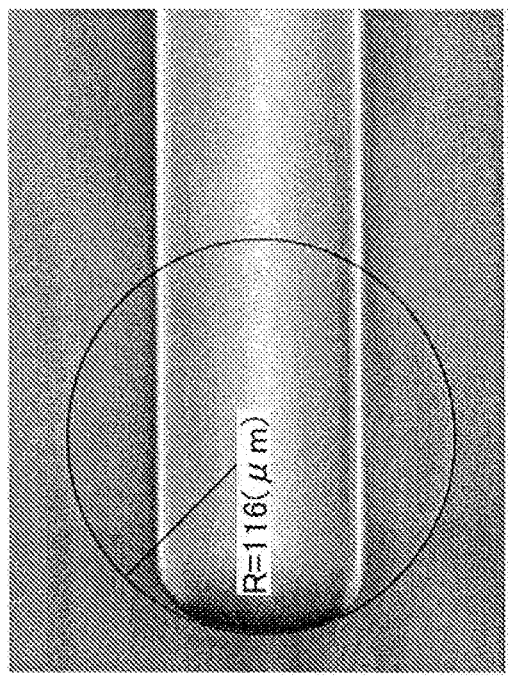
Figure 7C:
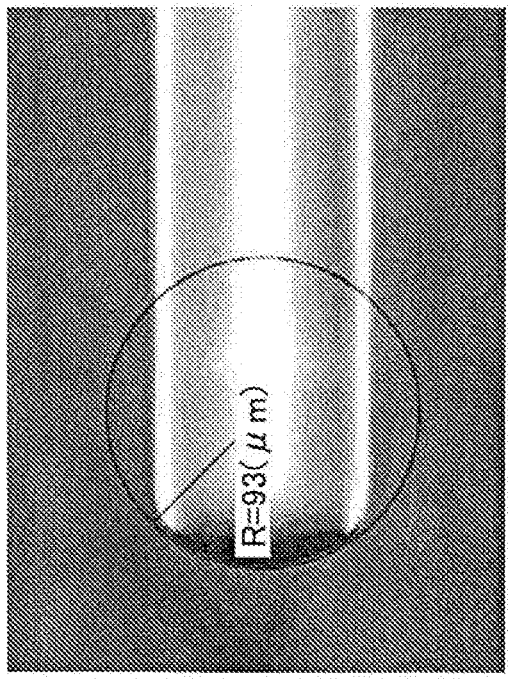
Figure 7D:
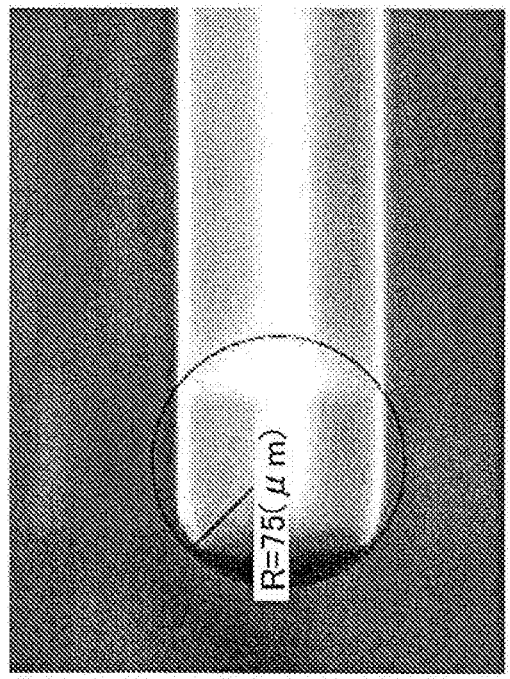

FIG. 7A is an optical probe of a comparative example, in which the incident surface 100 is a flat surface. FIG. 7B is an optical probe 10 in which the curvature radius R of the incident surface 100 is 116 µm. FIG. 7C is an optical probe 10 in which the curvature radius R of the incident surface 100 is 93 µm. FIG. 7D is an optical probe 10 in which the curvature radius R of the incident surface 100 is 75 µm.

Note that the incident surface 100 of the optical probe of the comparative example, which is shown in FIG. 7A, is formed into a flat surface, for example, by end surface polishing in which an optical fiber is fixed by a jig and an abrasive and a sheet are used. Moreover, for spherical machining of forming the incident surface 100 of each of the optical probes 10 shown in FIGS. 7B to 7D into a surface with the curvature radius R, a variety of such methods as follows are adoptable. For example, the spherical machining of the incident surface 100 is implemented by a method of shaping an end portion of the optical fiber, from which a protective coating is peeled off, by local heating by high-frequency discharge, a method of melt-shaping the end portion of the optical fiber by pulse irradiation of a $CO_2$ laser, a method of polishing the end portion of the optical fiber by using a sheet and an abrasive, and the like. Note that the incident surface 100 is shaped so as to be formed into a substantially symmetrical shape with respect to a circumferential direction of the central axis C10. It is not preferable that the shape of the incident surface 100 be asymmetrical since the transmission loss caused by the tolerances δ then becomes asymmetrical on the XY plane to increase the loss variation ΔL.

Figure 8:
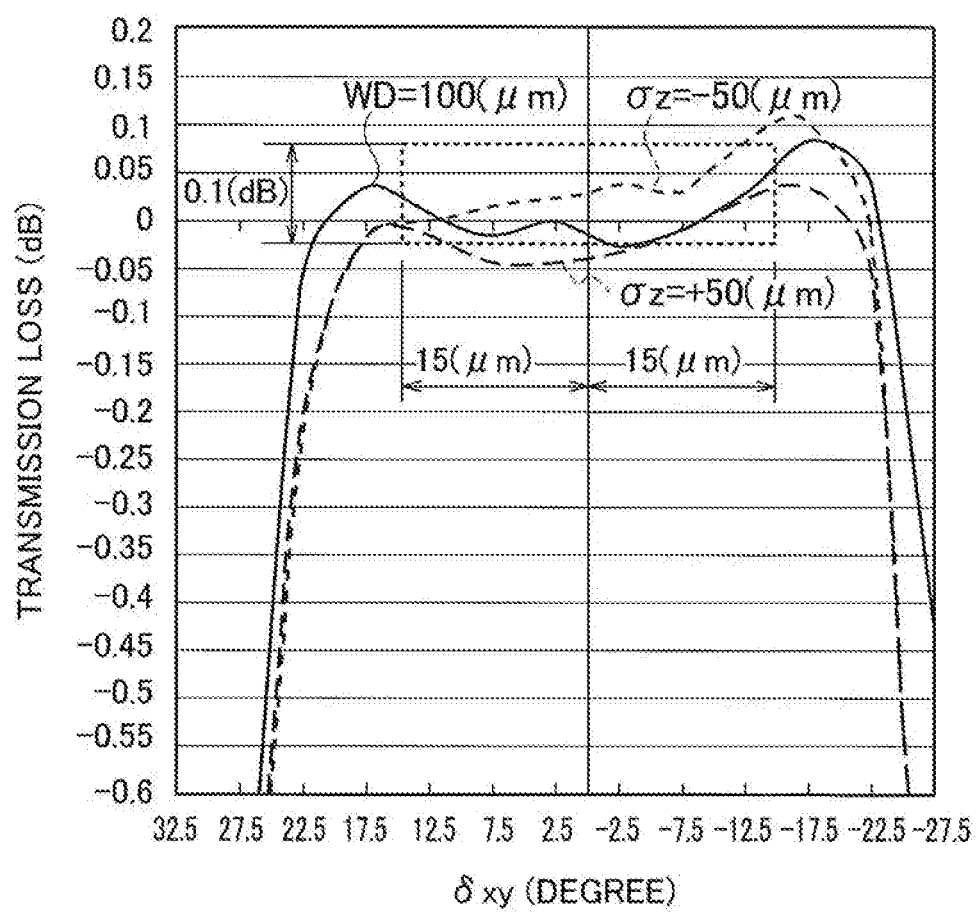
FIG. 8 is a graph illustrating an example of the relationships between the transmission losses and the tolerances in the optical probe according to the first embodiment of the present invention.

FIG. 8 is a graph illustrating relationships between the tolerances δ and the transmission losses in the case of receiving the optical signal L with the maximum radiation half angle αm of 12 degrees, the relationships being measured for the optical probe 10 with the curvature radius R of 116 µm, which is shown in FIG. 7B. In FIG. 8, the transmission loss at the working distance WD of 100 µm, which is a reference distance, is indicated by a solid line, the transmission loss at the tolerance δz of −50 µm and the working distance WD of 150 µm is indicated by a short-dashed dotted line, and the transmission loss at the tolerance δz of +50 µm and the working distance WD of 50 µm is indicated by a long-dashed dotted line.

As illustrated in FIG. 8, with regard to loss characteristics at the working distances WD of 100 µm and 150 µm, the loss variation ΔL is 0.1 dB or less in the range where the tolerance δxy is ±15 µm. In the range where the tolerance δz is ±15 µm, the variation of the transmission loss becomes approximately ⅓ of that in the case where the tolerance δz is ±50 µm, and accordingly, the condition of ΔL≤0.1 dB is sufficiently satisfied.

Figure 9:
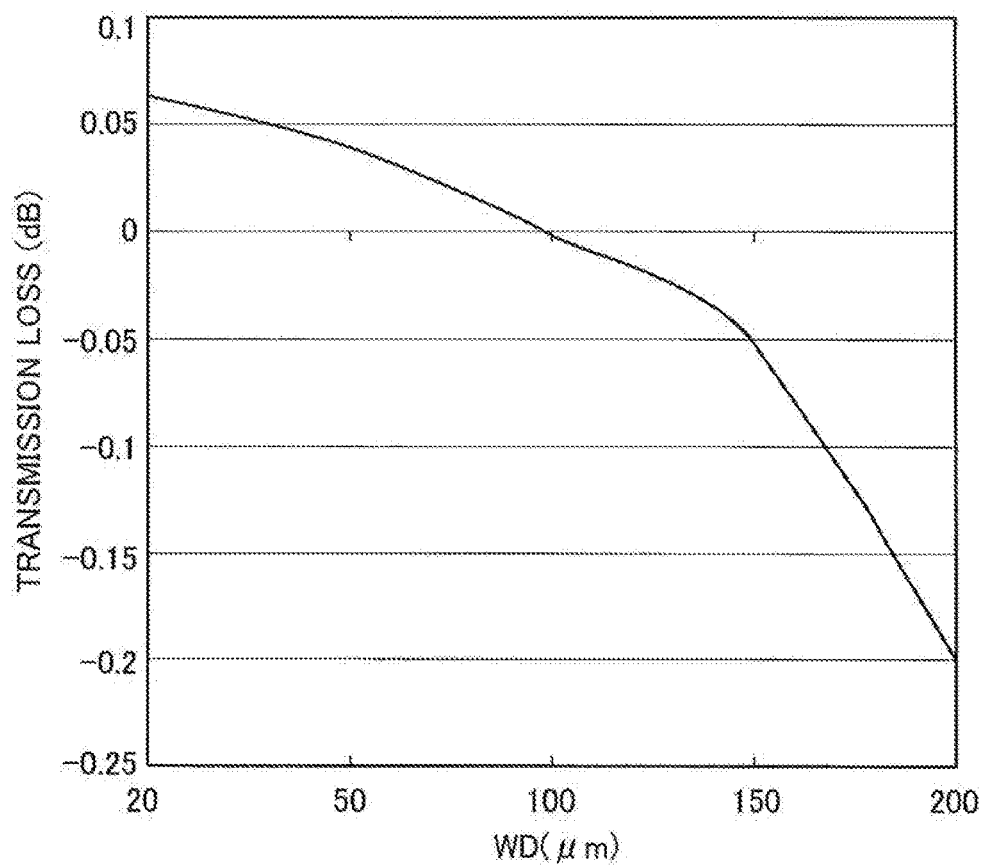
FIG. 9 is a graph illustrating an example of a relationship between the transmission loss and the working distance in the optical probe according to the first embodiment of the present invention.

FIG. 9 is a graph illustrating a result of measuring, with regard to the optical probe 10 with the curvature radius R of 116 µm, a relationship between the transmission loss and the working distance WD when the tolerance δz occurs with 100 µm taken as a reference of the working distance WD and the working distance WD changes. A loss variation ΔLz in a range where the working distance WD is 100±15 µm is approximately ±0.015 dB. Moreover, a loss variation ΔLxy of the optical probe 10 with the curvature radius R of 116 µm when the tolerance δxy of the XY plane is ±15 µm is 0.083 dB from FIG. 8. Hence, a total loss variation ΔLxyz caused by the tolerance δz in the Z-axis direction and the tolerance δxy of the XY plane is ΔLxy+ΔLz=0.098 dB, which is smaller than 0.1 dB. That is, the optical probe 10 with the curvature radius R of 116 µm has the loss variation ΔL of 0.1 dB or less in the range where the tolerances δ are ±15 µm, and is suitably used for the optical probe array.

Figure 10:
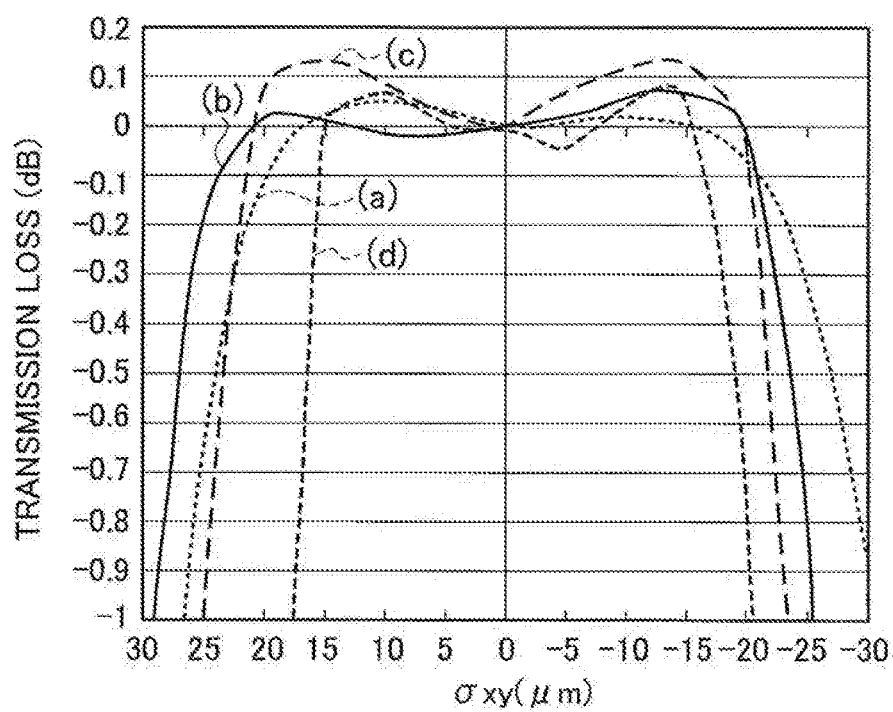
FIG. 10 is a graph comparing relationships between transmission losses and tolerances in the optical probes shown in FIGS. 7A to 7D.

FIG. 10 is a graph illustrating results of measuring, for the optical probes shown in FIGS. 7A to 7D, the relationships between the tolerances δxy of the XY planes and the transmission losses when the maximum radiation half angle αm of the optical signal L is 12 degrees. In FIG. 10, the transmission loss of the optical probe in the comparative example of FIG. 7A is indicated by a broken line. Moreover, the transmission loss of the optical probe 10 with the curvature radius R of 116 µm in FIG. 7B is indicated by a solid line, the transmission loss of the optical probe 10 with the curvature radius R of 93 µm in FIG. 7C is indicated by a long-dashed dotted line, and the transmission loss of the optical probe 10 with the curvature radius R of 75 µm in FIG. 7D is indicated by a short-dashed dotted line.

As illustrated in FIG. 10, the optical probe 10 with the curvature radius R of 116 µm in FIG. 7B exhibits the flattest loss characteristics with respect to the tolerance δxy of the XY plane. Then, as the curvature radius R becomes smaller, a region where the loss characteristics with respect to the tolerance δxy are flat is narrowed. A main reason why the region where the loss characteristics are flat is narrowed is that, when the curvature radius R becomes smaller, then the incident angle of the optical signal L becomes larger as the tolerance δxy becomes larger, reflection of the optical signal L on the incident surface 100 becomes larger, incident light becomes smaller, and the transmission loss increases. Therefore, a preferable one in terms of the loss characteristics among the optical probes 10 in FIGS. 7B to 7D is the optical probe 10 with the largest curvature radius R of 116 µm. Moreover, in the optical probe 10 with the curvature radius R of 116 µm, flat loss characteristics are obtained with respect to wider-range tolerances δ than in the optical probe of the comparative example, in which the incident surface 100 is a flat surface.

As described above, in accordance with the optical probe 10 according to the first embodiment, the incident surface 100 is formed into a convex spherical surface, whereby the travel direction of the optical signal L is controlled to be substantially parallel to the central axis C10 on the incident surface 100. Moreover, a diameter of the optical waveguide 11 of the optical probe 10 is made large, whereby a size of an opening diameter of the incident surface 100 is increased, and the incident angle of the optical signal L is widened. Thus, suppressed is the variation of the transmission loss with respect to the tolerances caused due to the variation of the working distance WD, the variation of the angle at which the optical signal L enters the incident surface 100, and the like. Moreover, the variation of the transmission loss is suppressed, whereby a chronological variation of a measured value is also suppressed.

Figure 11:
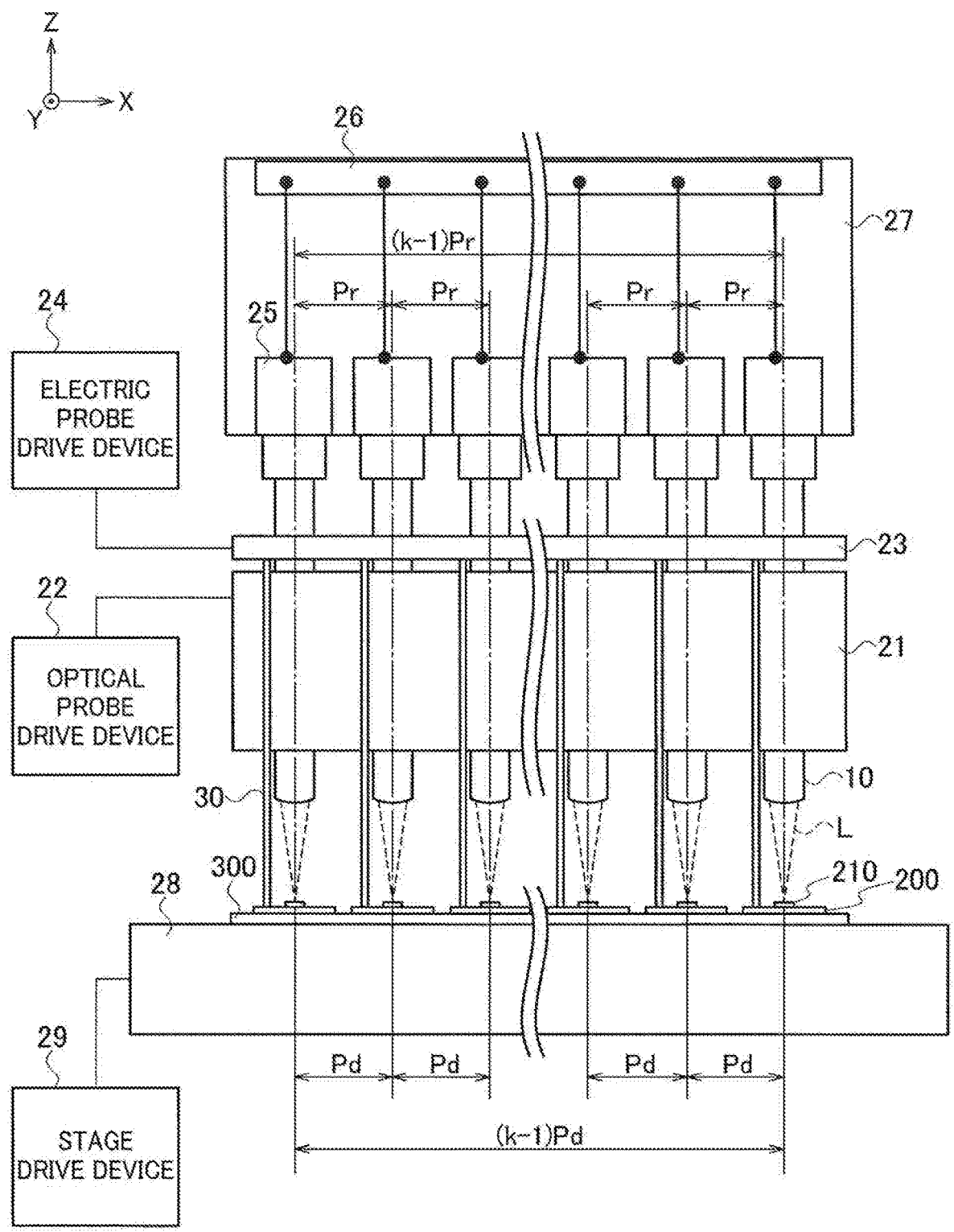
FIG. 11 is a schematic diagram illustrating a configuration of a test system according to the first embodiment of the present invention.

Next, a test system using the optical probe 10 will be described. FIG. 11 illustrates a test system including an optical probe array composed by arranging a plurality of the optical probes 10 in an array shape while orienting the incident surfaces 100 in the same direction. The test system includes an optical probe head 21 that holds the optical probes 10, and an electric probe head 23 that holds electric probes 30. As the electric probes 30, for example, those of a cantilever type, a vertical needle type, a vertical spring type and the like are used. As illustrated in FIG. 11, the optical probes 10 and the electric probes 30 are individually arranged at equal intervals at a pitch Pr along the X-axis direction. Although not illustrated, the optical probes 10 and the electric probes 30 are arranged at equal intervals also along the Y-axis direction as well as the X-axis direction.

Figure 12:
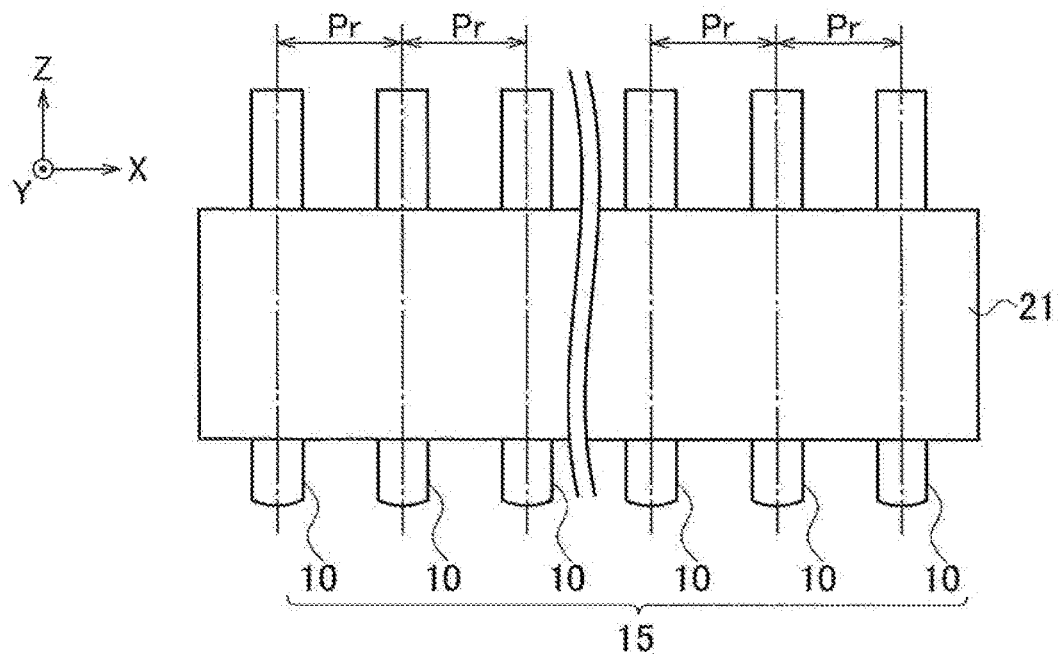
FIG. 12 is a schematic diagram illustrating a configuration of an optical probe array.
Figure 13:
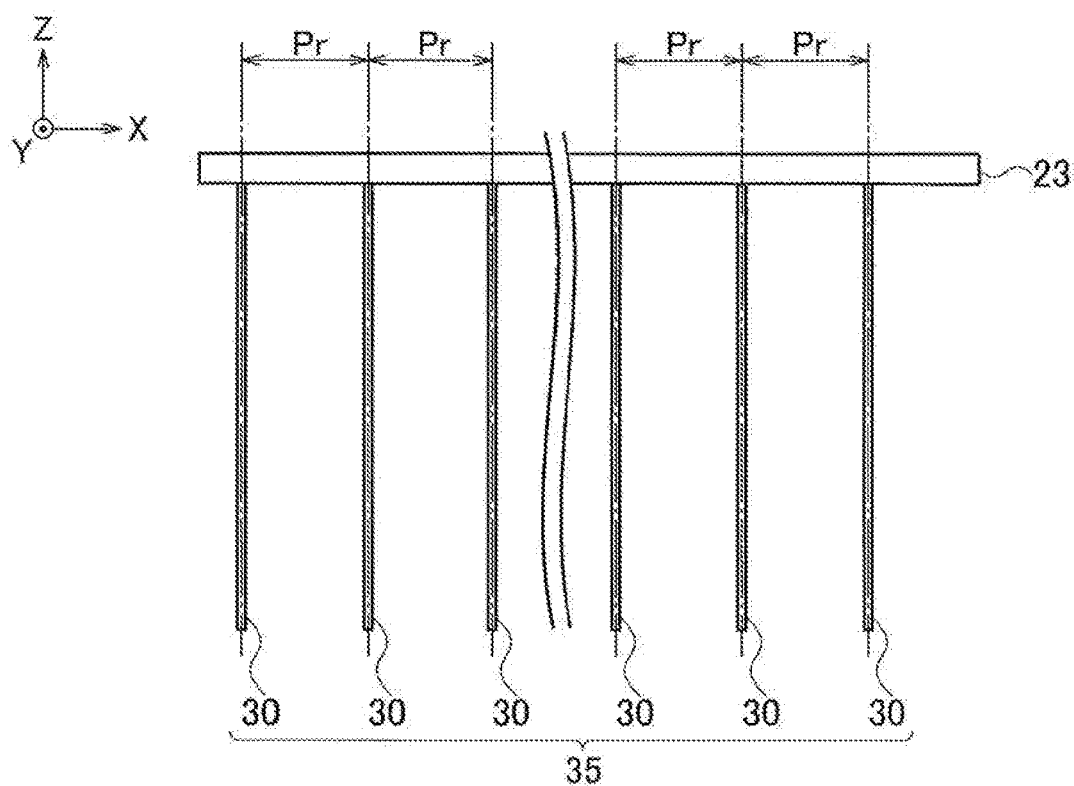
FIG. 13 is a schematic diagram illustrating a configuration of an electric probe array.

As illustrated in FIG. 12, the optical probe head 21 holds the plurality of optical probes 10 which compose an optical probe array 15. Moreover, as illustrated in FIG. 13, the electric probe head 23 holds the plurality of electric probes 30 which compose an electric probe array 35.

The test system illustrated in FIG. 11 is used for a characteristic test of a plurality of the test subjects 200 formed on a semiconductor substrate 300. The semiconductor substrate 300 is, for example, a gallium arsenide (GaAs) substrate or a silicon (Si) substrate. On a main surface of the semiconductor substrate 300 mounted on a stage 28, the test subjects 200 are formed in an array shape at equal intervals at a pitch Pd when viewed in a surface normal direction. For example, for the single test subject 200, the optical probes 10 and the electric probes 30 are arranged as pairs. Then, tip ends of the electric probes 30 contact electrical signal terminals (not shown) of the test subjects 200, and electrical signals are applied to the test subjects 200. The optical signals L output from the test subjects 200 to which the electrical signals are applied are received by the optical probes 10.

As described above, for the single test subject 200, a single probe unit including the optical probe 10 and the electric probe 30 is composed. Such probe units are arranged so as to correspond to arrangement of the test subjects 200 formed on the semiconductor substrate 300. Note that FIG. 11 illustrates, as an example, the case where each of the number of optical probes 10 which compose a single measuring unit and the number of electric probes 30 which compose the same is one. However, the number of optical probes 10 included in the measuring unit and the number of electric probes 30 included therein are set arbitrarily in response to a configuration of the test subjects 200 and a test content.

The optical probe head 21 moves in the Z-axis direction by control of an optical probe drive device 22. Thus, a fine adjustment of a distance between the incident surface 100 of each optical probe 10 and each test subject 200 along the Z-axis direction is possible. Moreover, the electric probe head 23 moves in the Z-axis direction by control of an electric probe drive device 24. Thus, a fine adjustment of a distance between the tip end of each electric probe 30 and each test subject 200 along the Z-axis direction is possible.

Alignment of the optical probe head 21 and the electric probe head 23 with the test subjects 200 in the X-axis direction and the Y-axis direction is possible by moving the stage 28 by a stage drive device 29. Moreover, the stage 28 is rotated about the Z-axis direction by the stage drive device 29, whereby positions of the optical probes 10 and the electric probes 30 can be adjusted for the test subjects 200 with respect to a rotation direction about the Z-axis direction (hereinafter, this rotation direction will be referred to as "Z-axis rotation direction").

Note that a position of the stage 28 may be fixed, and the optical probe head 21 and the electric probe head 23 may be moved in the respective directions which are the X-axis, Y-axis and Z-axis directions. That is, by the optical probe drive device 22 and the electric probe drive device 24, relative positions of the optical probes 10 and the electric probes 30 to the test subjects 200 may be adjusted.

As described above, in accordance with the test system illustrated in FIG. 11, the alignment of the optical probes 10 and the electric probes 30 with the test subjects 200 is possible. Note that the test system may be composed so that a position of the optical probe head 21 and a position of the electric probe head 23 can be controlled independently of each other. Besides, also possible is a method of controlling and adjusting the respective positions of the optical probe head 21, the electric probe head 23 and the test subjects 200 in such a manner that the optical probe head 21 and the electric probe head 23 are fixed and the stage 28 is moved in the X-axis, Y-axis and Z-axis directions and the Z-axis rotation direction. As described above, a variety of adjustment methods can be used for the alignment of the optical probes 10 and the electric probes 30 with the test subjects 200.

The electrical signals and the optical signals propagate through the test system illustrated in FIG. 11, and the test subjects 200 are tested. Specifically, electrical signals output from a tester (not shown) are transmitted to the electric probes 30 through connection terminals (not shown) arranged in the electric probe head 23. For example, when the test subjects 200 are VCSELs formed on a semiconductor substrate, the electrical signals are applied by the electric probes 30 to electrical signal terminals arranged on upper surfaces of the VCSELs, whereby the VCSELs output the optical signals L. The optical signals L are received by the optical probes 10.

The optical probes 10 connect to a photoelectric conversion unit 27 including photoelectric conversion modules 25 and an electrical connection terminal 26. The optical signals L output by the test subjects 200 propagate to the photoelectric conversion modules 25 which optically connect to the optical probes 10. The photoelectric conversion modules 25 convert the optical signals L into electrical signals, and output the converted electrical signals to the electrical connection terminal 26. The electrical connection terminals 26 electrically connect to a tester (not shown), and the electrical signals subjected to the photoelectric conversion from the optical signals L are transmitted to the tester from the electrical connection terminal 26.

The test of the test subjects 200, which uses the test system illustrated in FIG. 11, is executed, for example, in the following manner. First, the relative positions of the electric probes 30 and the test subjects 200 are changed along the Z-axis direction, thereby connecting the tip ends of the electric probes 30 to the electrical signal terminals of the test subjects 200. Then, the electrical signals are applied to the test subjects 200 by the electric probes 30, whereby the test subjects 200 output the optical signals L.

Next, the optical probe head 21 is moved in the Z-axis direction, and the optical probes 10 are arranged so as to ensure a predetermined working distance WD. Then, the optical signals L received by the optical probes 10 are subjected to the photoelectric conversion by the photoelectric conversion modules 25, and optical outputs of the optical signals L are monitored. At this time, the positions of the optical probes 10 are controlled so that the outputs of the optical signals L from the test subjects 200 are maximized. Particularly, in order that the optical outputs of the optical signals L received by the optical probes 10 on an outer edge of the optical probe array 15, that is, the optical outputs of the optical signals L from the test subjects 200 located on an outer edge of a test range are maximized, the position of the optical probe head 21 is adjusted. Then, the optical probes 10 are fixed at a position where the optical outputs of the optical signals L are the maximum. In this state, the optical signals L from the optical probes 10 are measured. Thus, the test subjects 200 can be tested.

For the photoelectric conversion modules 25, there can be used those of a type of converting the optical signals L into the electrical signals by photodetectors and the like, and of a type of performing spectroscopy for the optical signals L by a diffraction grating-type device and detecting wavelength variations by diffraction angle directions thereof. The types of the photoelectric conversion modules 25 can be selected properly depending on the purpose of measurement. Moreover, a plurality of types of measurements can be performed simultaneously by branching the optical signals L from the front of the photoelectric conversion modules 25. The outputs of the optical probes 10 are subjected to the photoelectric conversion by using the photoelectric conversion unit 27 in the vicinity of the optical probe head 21, whereby the test system can be simplified, a measurement time can be shortened, and repeated reproducibility of measured values can be improved.

As another test method, the alignment with the test subjects 200 can be performed simultaneously for the electric probes 30 and the optical probes 10. When positional accuracy of the optical probes 10 and the electric probes 30 with the test subjects 200 is ensured, the distance between the tip ends of the electric probes 30 and the incident surfaces 100 of the optical probes 10 in the Z-axis direction is substantially equal to the working distance WD. Therefore, q is defined as an overdrive amount in the Z-axis direction when the tip ends of the electric probes 30 are thrust against the electrical signal terminals of the test subjects 200 and overdrives are applied thereto, and the interval between the incident surfaces 100 of the optical probes 10 and the test subjects 200 is set to WD+q. Then, the optical probes 10 and the electric probes 30 are coupled and fixed or integrated with each other, and the positions thereof are controlled in the respective axial directions and the Z-axis rotation direction. The overdrive amount q is set within a range of 30 $\mu m \geq q \geq 5$ $\mu m$. Thereafter, in order to return the positions of the tip ends of the optical probes 10 in the optical axis direction and of the tip ends of the electric probes 30 therein to those at the working distance WD, the electric probes 30 warp in the optical axis direction by the overdrive amount q.

Although the size of the tip ends of the electric probes 30 is small, the size of the electrical signal terminals of the test subjects 200 is generally as large as approximately 100 $\mu m$. Therefore, even if the tolerances of the machine work and tolerances of approximately ±10 $\mu m$ in the step of mounting the electric probes 30 on the electric probe head 23, it is possible to align the electrical signal terminals and the electric probes 30 with each other.

Meanwhile, if $\delta=0$ is established in the case of Pd−Pr=$\delta$, then the alignment of the optical probes 10 with the test subjects 200 is easy when the optical probes 10 can be aligned with the test subjects 200 at one spot. However, in usual, the tolerances $\delta$ occur in machine work and the step of mounting the optical probes 10 on the optical probe head 21.

For example, when k is the number of optical probes 10 arranged along the X-axis direction and the Y-axis direction, position tolerances of at most $\delta \times (k-1)$ occur between the light emitting portions 210 of the test subjects 200 and the optical probes 10. Therefore, it is necessary to select the optical probes 10 so that the loss variation hardly occurs due to the position tolerances of $\delta \times (k-1)$ on the XY plane, which occur between the test subjects 200 and the optical probes 10. Hence, the optical probes 10 with the loss variation $\Delta L$ of 0.1 (dB) can be suitably used for the optical probe array 15.

Note that, preferably, the working distance WD is 100 $\mu m$ or more. This is because, when the working distance WD is short, the incident surfaces 100 of the optical probes 10 may contact the test subjects 200 at the time of adjusting the positions of the optical probes 10, and the test subjects 200 may be damaged or broken. Moreover, when the working distance WD is short, the test subjects 200 are likely to be affected by reflected return light on the incident surfaces 100. When the test subjects 200 are affected by the reflected return light, optical noises are generated in the optical signals L, noises are added to measured values, and the measured values vary and become unstable. Therefore, a shape of spots where the optical probe head 21 fixes the optical probes 10 is formed to be a V shape, a U shape or a circular shape when viewed in the Z-axis direction. Thus, Pd−Pr=$\delta$ became ±1 $\mu m$ or less, and an accumulated value ($\delta \times 12$) of the position tolerances in the case of k=12 also became ±15 $\mu m$ or less.

As described above, in the test system illustrated in FIG. 11, the positions of the optical probes 10 and the electric probes 30 are controlled simultaneously or separately, the test subjects 200 and the electric probes 30 are electrically connected to each other, and the test subjects 200 and the optical probes 10 are optically connected to each other. The curvature radius R and central half angle $\beta$ of the incident surface 100 of each optical probe 10 are set so as suppress the loss variation against the tolerances $\delta$ which occur at the time of manufacturing the optical probe array 15. Therefore, in accordance with the test system using the optical probes 10, the plurality of test subjects 200 formed on the semiconductor substrate 300 can be tested simultaneously and accurately.

Hence, in accordance with the test system illustrated in FIG. 11, a test time of the test subjects 200 can be shortened to a large extent in comparison with the case of testing the test subjects 200 by aligning the test subjects 200 and the optical probes with each other one by one. Thus, for example, also solved is a problem that all of the test subjects 200 cannot be measured because of a restriction of the test time. Moreover, in accordance with the test system illustrated in FIG. 11, it is not necessary to control the positions of the optical probes 10 for each of the test subjects 200 in order to receive the optical signals L which are stable, and it is possible to align the test subjects 200 at least one line by one line or while integrating many lines, and accordingly, the test time can be shortened to a large extent. Therefore, by the test, all of the test subjects 200 formed on the semiconductor substrate 300 can be subjected to quality determination.

Next, a method of testing a radiation angle $2\alpha$ of each optical signal L, which is output from the test subject 200, by using the test system illustrated in FIG. 11 with reference to FIG. 14 will be described by using a flowchart of FIG. 15.

Figure 14:
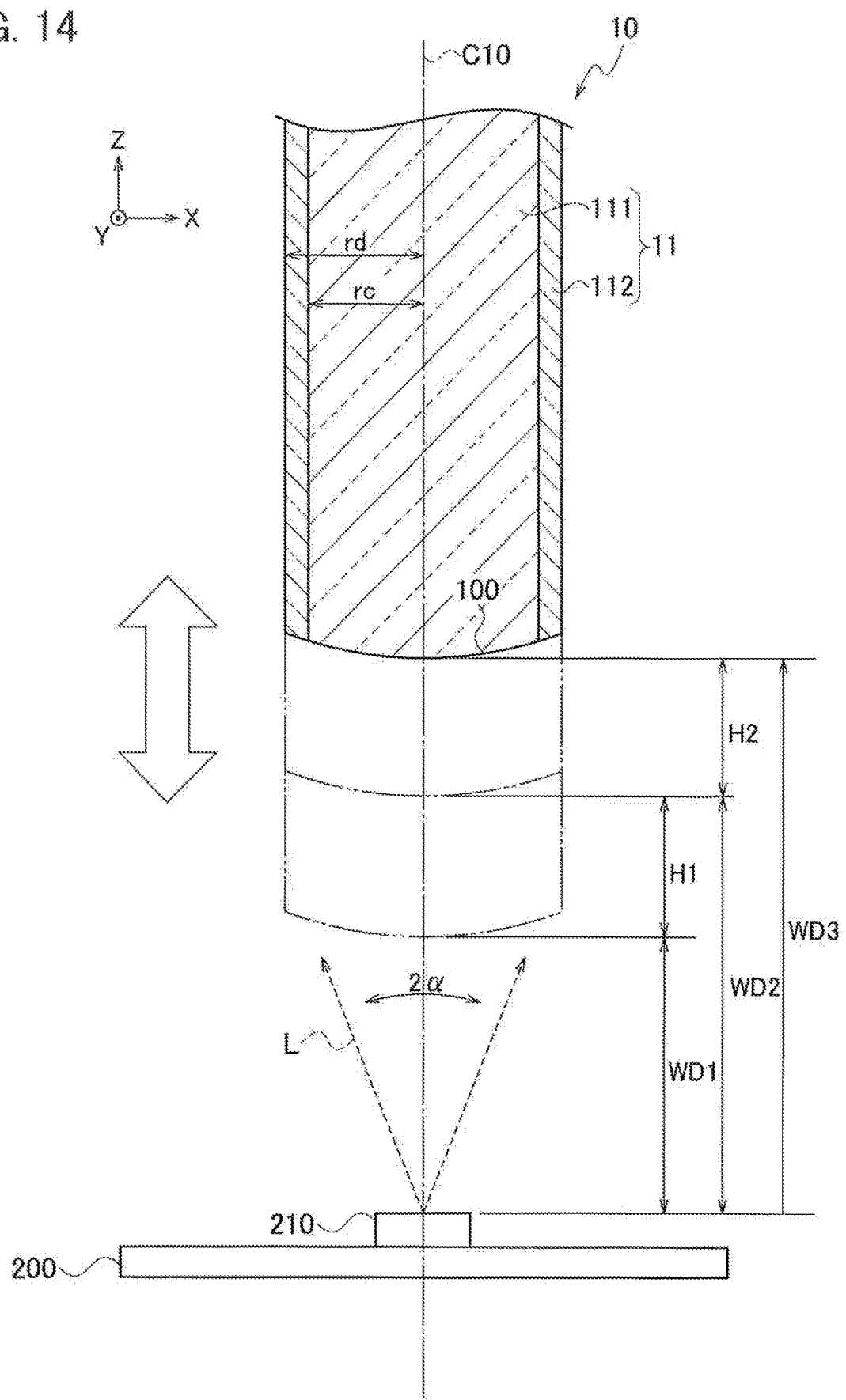
FIG. 14 is a schematic diagram for explaining a test method according to the first embodiment of the present invention.
Figure 15:
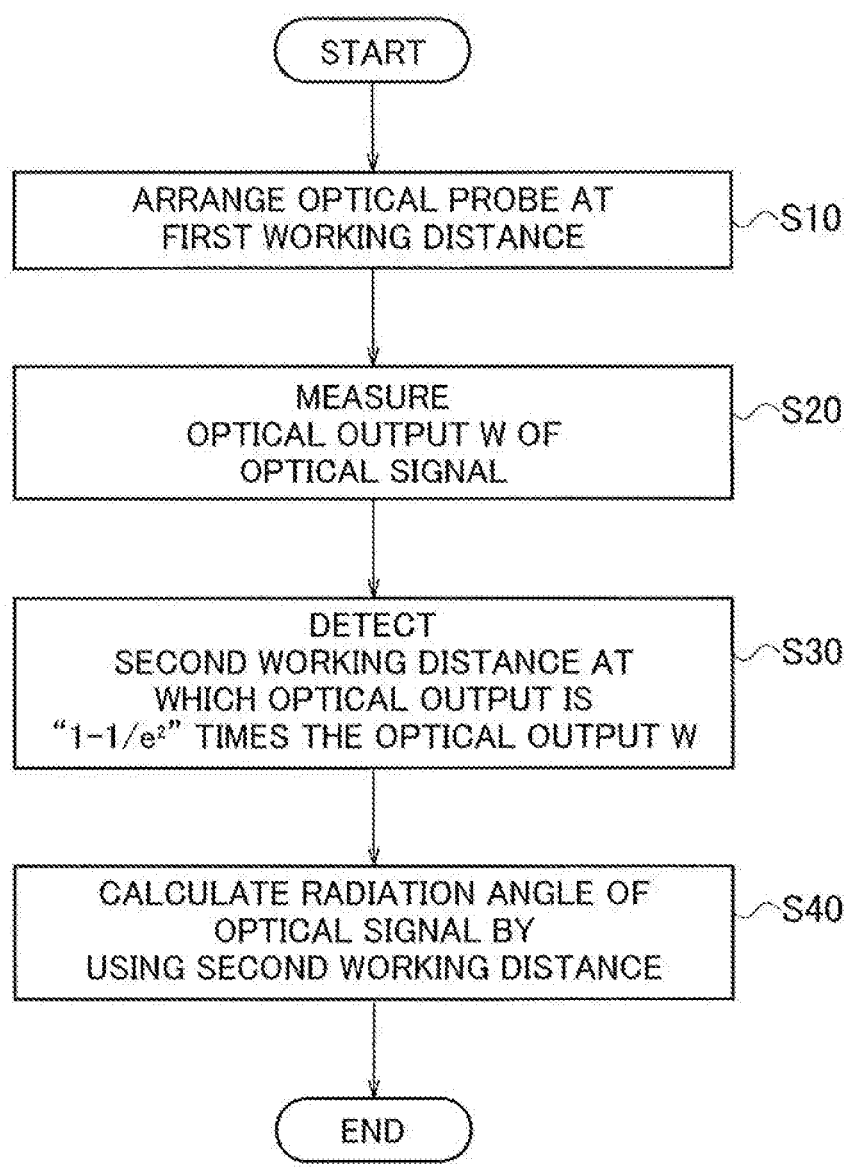
FIG. 15 is a flowchart for explaining the test method according to the first embodiment of the present invention.

First, in Step S10 of FIG. 15, each optical probe 10 is arranged at a first working distance WD1 from the test subject 200, the first working distance WD1 being illustrated in FIG. 14. The first working distance WD1 is such a working distance WD at which the whole of the optical signal L with the radiation angle $2\alpha$ enters. For example, the first working distance WD1 is set to the maximum working distance WDm at which the radiation range of the optical signal L remains inside the outer edge of the core portion 111 of the incident surface 100. Then, in Step S20, an optical output W of the optical signal L at the first working distance WD1 is measured.

Subsequently, in Step S30, a relative distance between the optical probe 10 and the test subject 200, which goes along the extending direction of the optical axis C200, is changed, and detected is a second working distance WD2 at which a light intensity of the optical signal L that enters the incident surface 100 becomes a constant ratio to the optical output W. The second working distance WD2 is set based on a light intensity that defines the radiation angle of the optical signal L while taking the optical output W as a reference. For example, detected is such a second working distance WD2 at which, when a range of a direction where the optical signal L travels with the intensity of $1/e^2$ or more of the peak value of the optical signal L is defined as the radiation range of the optical signal L, the optical output of the optical signal L is "$1-1/e^2$" times the optical output W, that is, 86.5% of the optical output W. An interval between the first working distance WD1 and the second working distance WD2 when the optical probe 10 is moved along the Z-axis direction as illustrated in FIG. 14 is defined as H1. In this case, the radiation half angle α is represented by Equation (9):

$$\tan(\alpha) = rc/WD2 \quad (9)$$

Therefore, in Step S40, the radiation angle 2α of the optical signal L is calculated by using the following Equation (10):

$$2\alpha = 2 \times \tan^{-1}(rc/WD2) \quad (10)$$

Moreover, the optical probe 10 is moved along the Z-axis direction up to a third working distance WD3 at which the optical output of the optical signal L is a half of the optical output W. An interval between the second working distance WD2 and the third working distance WD3 is defined as H2. In this case, by Equation (11), a half-value full angle 2αh is calculated as a radiation angle at which the optical output of the optical signal L is a half of the peak value:

$$2\alpha h = 2 \times \tan^{-1}(rc/(WD2+H2)) \quad (11)$$

As a result of calculating the radiation angle 2α for the optical probe 10 with a core diameter of 89 μm by using Equation (10), 2α=21.53 degrees was obtained under conditions where the first working distance WD1 was 50 μm, the interval H1 was 184 μm, and the second working distance WD2 was 234 μm. Moreover, by using Equation (11), the half-value full angle 2αh=17.09 degrees was obtained under a condition where the interval H2 was 44 μm. Meanwhile, in tests by a far field pattern (FFP) measuring instrument, 2α was 21.19 degrees, and 2αh was 17.64 degrees. Hence, it was confirmed that the results obtained by the above-described test method using the test system illustrated in FIG. 11 and the results of such a test method using the FFP measuring instrument substantially coincided with each other.

In the test method using the test system described above, the optical output is monitored while changing the position of the optical probe array 15 along the optical axis C200, thus making it possible to test the radiation angle in the wafer state. In accordance with this test method, the radiation angles 2α of the plurality of test subjects 200 formed on the semiconductor substrate 300 can be tested collectively in a short time. Moreover, it is not necessary to separately prepare a measuring apparatus such as the FFP measuring instrument in order to test the radiation angles of the test subjects 200, and the test time and cost can be suppressed.

Second Embodiment

Figure 16:
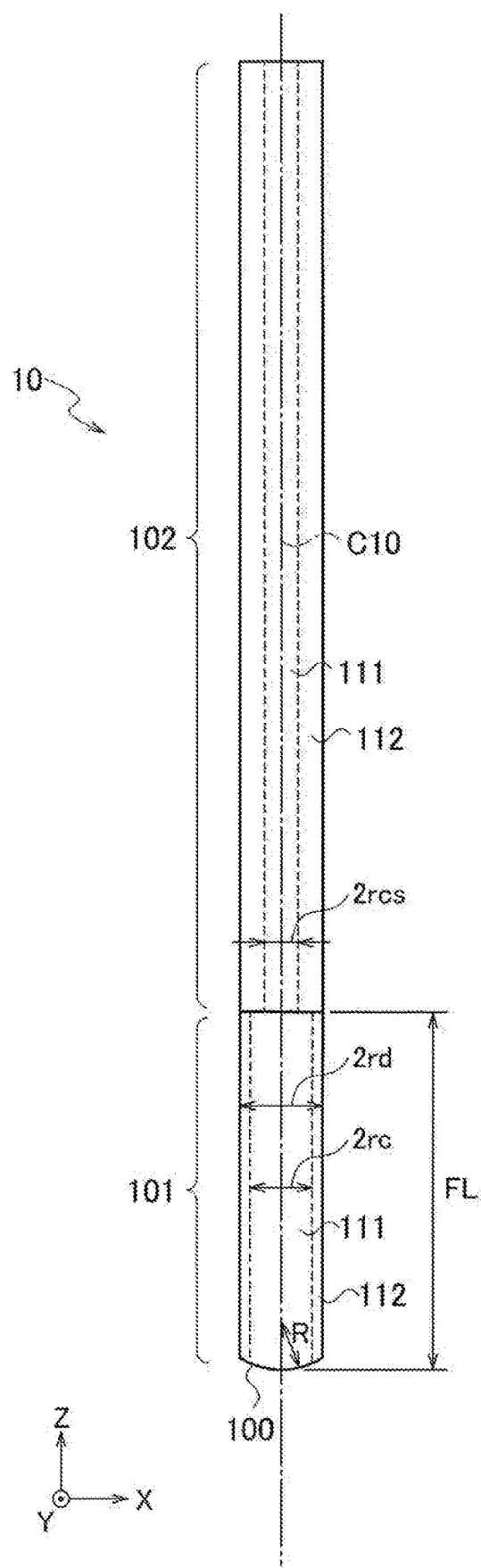
FIG. 16 is a schematic view illustrating a configuration of an optical probe according to a second embodiment of the present invention.

In an optical probe 10 according to a second embodiment of the present invention, as illustrated in FIG. 16, the optical waveguide 11 has a configuration in which a first region 101 and a second region 102 having a core diameter smaller than the first region 101 are coupled to each other. That is, a core diameter $2rc$ of the first region 101 is larger than a core diameter $2rcs$ of the second region 102. The incident surface 100 is formed on one end of the first region 101, and the other end of the first region 101 is coupled to the second region 102.

The first region 101 on which the incident surface 100 is formed has a structure similar to that of the optical probe 10 described in the first embodiment. That is, in the first region 101, a curvature radius R and central half angle β thereof are set so as to satisfy the relationships of Equations (5) and (6).

The optical probe 10 illustrated in FIG. 16 may be composed by using a large-diameter GI-type optical fiber for the first region 101 and a standard-diameter GI-type optical fiber for the second region 102. For example, a large-diameter optical fiber with a core diameter of 90 μm is used for the first region 101, and a standard-diameter optical fiber with a core diameter of 62.5 μm is used for the second region 102.

The optical probe 10 illustrated in FIG. 16 is manufactured, for example, in the following manner. First, an end surface of the large-diameter GI-type optical fiber and an end surface of the standard-diameter GI-type optical fiber are fusion-spliced to each other. Then, the large-diameter GI-type optical fiber is cut to a predetermined length of the first region 101. Thereafter, the end surface of the large-diameter GI-type optical fiber is processed to obtain the curvature radius R.

Figure 17:
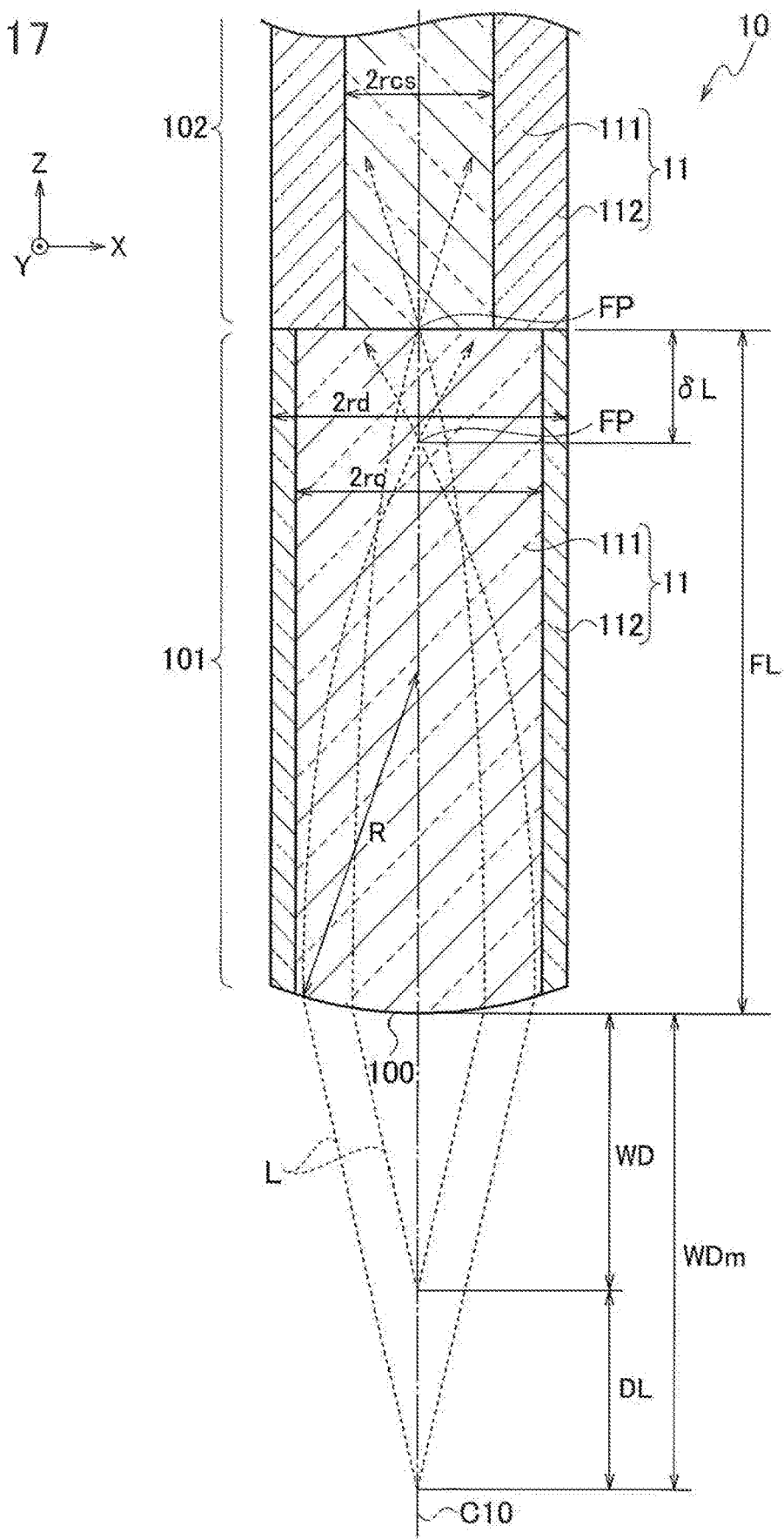
FIG. 17 is a schematic view illustrating a configuration of an end portion of the optical probe according to the second embodiment of the present invention.

FIG. 17 illustrates an end portion of the optical probe 10 illustrated in FIG. 16. The optical signal L from the test subject 200 travels from the incident surface 100 of the first region 101 in substantially parallel to the optical axis C200, and thereafter, converges in the vicinity of a boundary between the first region 101 and the second region 102. Thereafter, the optical signal L travels through the core portion 111 of the second region 102. A focus point FP of the optical signal L is adjusted to the vicinity of the boundary between the first region 101 and the second region 102, whereby the optical signal L propagates through the optical probe 10 with a low loss. This is because the relationship of $rc > \delta$ can suppress the transmission loss of the optical signal L even if the focus point FP shifts by approximately the tolerance δ when the relative position of the test subject 200 to the optical probe 10 shifts due to the tolerance δ. FIG. 17 illustrates an example where the focus point FP moves by δL when the position of the light source of the optical signal L shifts by the distance DL in the Z-axis direction.

In order to adjust the focus point FP of the optical signal L to the vicinity of the boundary between the first region 101 and the second region 102, a length FL along the Z-axis direction from the incident surface 100 to the boundary between the first region 101 and the second region 102 is set so as to satisfy the following Equation (12):

$$FL = 2\pi P/A^{1/2} + (WDm - WD)/n0 \quad (12)$$

In Equation (12), P is a coefficient (0≤P≤1) indicating a ratio to the cycle of the optical signal L that travels through the core portion 111, where P=1 corresponds to one cycle, and P=0.5 corresponds to a ½ cycle.

For example, when a large-diameter GI-type optical fiber with a refractive index distribution constant $A^{1/2}$ of 0.00436 is used for the first region 101, the coefficient P is 0.25 (¼ cycle), and the working distance WD is 100 μm, then the length FL is 434 μm in the optical probe 10 of the maximum working distance WDm is 209 μm and a refractive index n0 of 1.488. The length FL is set so that the focus point FP of the optical signal L is set to the vicinity of the boundary between the first region 101 and the second region 102, whereby the optical probe 10 can be connected to another component for an optical circuit while suppressing the transmission loss of the optical signal L.

As described above, the optical probe 10 according to the second embodiment has a configuration in which the first region 101 and the second region 102, which are different in core diameter from each other, are coupled to each other. The second region 102 with a standard core diameter is coupled to the large-diameter first region 101 on which the incident surface 100 is formed, whereby the end portion of the second region 102 can be connected to a component for an optical circuit, a coupler, an optical switch or the like, which uses an optical fiber with the standard core diameter, and a multi-input optical circuit with a low loss can be achieved. Others are substantially similar to those of the first embodiment, and a duplicate description will be omitted.

OTHER EMBODIMENTS

As above, the present invention has been described by the embodiments; however, it should not be understood that the description and the drawings, which form a part of this disclosure, limit the present invention. For those skilled in the art, varieties of alternative embodiments, examples and application technologies will be obvious from this disclosure.

For example, though the optical probe 10 in which the optical waveguide 11 is of the refractive index distribution type has been described above, the optical waveguide 11 may be of a step index type. Moreover, the optical waveguide 11 of the optical probe 10 may be composed of a material other than the optical fiber, and the incident surface 100 may be formed into a convex spherical surface.

As described above, it is natural that the present invention incorporates a variety of embodiments which are not described herein.

What is claimed is:

1. An optical probe that receives an optical signal output from a test subject, comprising:
   an optical waveguide composed of a core portion and a cladding portion disposed on an outer periphery of the core portion,
   wherein an incident surface of the optical waveguide, the incident surface receiving the optical signal, is a convex spherical surface with a substantially constant curvature radius,
   wherein, in a region of the optical waveguide, the region connecting to the incident surface,
   by using a maximum working distance WDm that is a maximum working distance WD adoptable between the test subject and the incident surface, a maximum radiation half angle $\alpha m$ made by an optical axis of the optical signal and a travel direction of the optical signal on an outermost edge of a radiation range of the optical signal at the maximum working distance WDm, and a refractive index n of the core portion at an incident point of the optical axis, a curvature radius R of the incident surface and a central half angle $\theta$ at the incident point substantially satisfy following relationships:

$$R = WDm \times \tan(\alpha m)/\{\sin(\beta)+(\cos(\beta)-1)\times \tan(\alpha m)\}$$

$$\beta = \tan^{-1}\{\sin(\alpha m)/(n-\cos(\alpha m))\}.$$

2. The optical probe according to claim 1, wherein the optical waveguide has a configuration in which a first region that connects to the incident surface and a second region in which a diameter of the core portion is smaller than in the first region are coupled to each other.

3. The optical probe according to claim 1, wherein a length FL from the incident surface to a boundary between the first region and the second region substantially satisfies a following relationship by using a coefficient $P(0 \leq P \leq 1)$ indicating a ratio to a cycle of the optical signal that travels through the core portion, a refractive index distribution constant $A^{1/2}$ of the core portion, and a refractive index n0 of a central axis of the core portion:

$$FL = 2\pi P/A^{1/2} + (WDm - WD)/n0.$$

4. An optical probe array including the optical probe according to claim 1,
   wherein the optical probe array is composed by arranging a plurality of the optical probes in an array shape while orienting the incident surfaces of the respective optical probes in a same direction,
   wherein, by using a core radius rc of the core portion, the maximum radiation half angle $\alpha m$, a tolerance $\delta z$ of a central axis of the core portion in an extending direction, and a tolerance $\delta xy$ of a plane perpendicular to the central axis of the core portion, the working distance WD of each of the optical probes satisfies a following relationship:

$$(rc - \delta xy)/\tan(\alpha m) - \delta z \geq WD.$$

5. A test system that tests an optical signal output from a test subject, comprising:
   an optical probe head that holds an optical probe according to claim 1;
   an optical probe drive device that controls a position of the optical probe head;
   an electric probe head that holds the electric probe while orienting a tip end of the electric probe in a same direction as in the incident surface; and
   an electric probe drive device that controls a position of the electric probe head,
   wherein a single probe unit including the optical probe and the electric probe is composed for the single test subject.

6. The test system according to claim 5, wherein a position of the optical probe head and a position of the electric probe head are controlled independently of each other.

7. The test system according to claim 5, wherein the electric probe and an electrical connection terminal of the test subject formed on a semiconductor substrate are aligned with each other, the optical probe head and the electric probe head are coupled and fixed or integrated with each other, and a position of a stage on which the semiconductor substrate is mounted is controlled.

8. A test method of receiving, by an optical probe, an optical signal output from a test subject, the test method comprising:
   disposing the optical probe at a first working distance from the test subject so that a whole of the optical signal enters the optical probe, and measuring an optical output of the optical signal;
   changing a relative distance of the optical probe and the test subject, the relative distance going along an extending direction of an optical axis of the optical signal, and detecting a second working distance at which an optical output of the optical signal becomes a constant ratio to an optical output at the first working distance; and by using a core radius rc of a core portion of the optical probe and the second working distance WD2, calculating a radiation angle $2a$ of the optical signal by using a following equation:

$$2\alpha = 2 \times \tan^{-1}(rc/WD2).$$

9. The test method according to claim 8,
wherein the first working distance is a maximum working distance at which a radiation range of the optical signal remains inside an outer edge of the core portion, and an optical output of the optical signal at the second working distance is "$1-1/e^2$" times an optical output of the optical signal at the first working distance.

* * * * *